(12) United States Patent  
Yoneya

(10) Patent No.: US 8,569,745 B2  
(45) Date of Patent: Oct. 29, 2013

(54) SEMICONDUCTOR DEVICE AND DISPLAY APPARATUS

(75) Inventor: Nobuhide Yoneya, Kanagawa (JP)

(73) Assignee: Sony Corporation, Tokyo (JP)

( * ) Notice: Subject to any disclaimer, the term of this patent is extended or adjusted under 35 U.S.C. 154(b) by 449 days.

(21) Appl. No.: 12/920,723

(22) PCT Filed: Jan. 8, 2009

(86) PCT No.: PCT/JP2009/050111  
§ 371 (c)(1),  
(2), (4) Date: Sep. 2, 2010

(87) PCT Pub. No.: WO2009/116304  
PCT Pub. Date: Sep. 24, 2009

(65) Prior Publication Data  
US 2011/0012097 A1 Jan. 20, 2011

(30) Foreign Application Priority Data  
Mar. 17, 2008 (JP) ................................ 2008-067225

(51) Int. Cl.  
*H01L 29/08* (2006.01)

(52) U.S. Cl.  
USPC ........... 257/40; 257/59; 257/72; 257/E51.003

(58) Field of Classification Search  
USPC ................. 257/40, 59, 72; 438/149  
See application file for complete search history.

(56) References Cited

U.S. PATENT DOCUMENTS

| 7,474,061 | B2* | 1/2009 | Oh et al. ............... 315/169.3 |
| 8,168,983 | B2* | 5/2012 | Yagi ........................... 257/72 |
| 2005/0211975 | A1 | 9/2005 | Kawasaki et al. |
| 2005/0274953 | A1 | 12/2005 | Kim et al. |
| 2006/0223222 | A1* | 10/2006 | Choi et al. ................. 438/99 |
| 2007/0012916 | A1* | 1/2007 | Choi et al. ................. 257/40 |
| 2007/0176863 | A1* | 8/2007 | Oh et al. .................... 345/82 |
| 2008/0265442 | A1* | 10/2008 | Yagi ....................... 257/786 |
| 2011/0012198 | A1* | 1/2011 | Yagi ....................... 257/346 |

FOREIGN PATENT DOCUMENTS

| JP | 2005-277238 | 10/2005 |
| JP | 2006-005330 | 1/2006 |
| JP | 2006-279053 | 10/2006 |
| JP | 2006-352057 | 12/2006 |
| JP | 2007-293071 | 11/2007 |
| JP | 2008-021838 | 1/2008 |
| JP | 2008-277370 | * 11/2008 |
| WO | WO 2009011220 | * 1/2009 |

OTHER PUBLICATIONS

International Search Report dated Feb. 3, 2009.  
Japanese Office Action issued in related Japanese patent application No. 2008-067225 dated Apr. 2, 2013, 2 pages.  
Supplemental Japanese Office Action issued in related Japanese patent application No. 2008-067225 dated Apr. 2, 2013, 3 pages.  
Sheraw, et al., "Organic Thin-film Transistor-Driven Polymer-dispersed Liquid Crystal Displays on Flexible Polymeric Substrates", Applied physics letters, vol. 80, No. 6, pp. 1088-1099, dated Feb. 11, 2002.  
Japanese Office Action from Japanese counterpart application No. 2008-067225 dated Dec. 18, 2012.

* cited by examiner

*Primary Examiner* — A. Sefer  
(74) *Attorney, Agent, or Firm* — Dentons US LLP

(57) ABSTRACT

A semiconductor device includes an organic semiconductor layer, and a protective film. The protective film covers a side wall of the organic semiconductor layer. An insulating partition wall is disposed on the substrate. The partition wall includes an opening. The organic semiconductor layer includes a first portion that is disposed within the opening of the partition wall. The protective film fills the inside of the opening of the partition wall.

11 Claims, 9 Drawing Sheets

SEMICONDUCTOR DEVICE AND DISPLAY APPARATUS

TECHNICAL FIELD

The present invention relates to a semiconductor device and a display, and more particularly, relates to a semiconductor device using an organic semiconductor layer and a display using the semiconductor device.

BACKGROUND ART

Thin film transistors are widely used in electronic circuits, in particular, as pixel transistors in active-matrix-driven flat displays. In recent years, use of organic materials for such low-profile semiconductor devices has been receiving attention. In thin film transistors using organic materials for semiconductor layers, i.e., organic thin film transistors (OTFTs), it is possible to form semiconductor layers at a reduced temperature compared to structures in which inorganic materials are used for semiconductor layers. Therefore, organic thin film transistors are advantageous in terms of the increase in area thereof, and can be formed on non-heat-resistant, flexible substrates, such as plastic substrates. An increase in the range of functions and a reduction in cost are also expected.

FIG. 14 shows an example of a configuration of an organic thin film transistor. In the organic thin film transistor shown in this drawing, a gate-insulating film 103 is disposed in such a state as to cover a gate electrode 102 on a substrate 101. On the gate-insulating film 103, a source 104s and a drain 104d are formed at positions corresponding to the two sides of the gate electrode 102, and an organic semiconductor layer 105 constituting a channel portion is further disposed on a portion stacked on the gate electrode 104 between the source 104s and the drain 104d. The organic semiconductor layer 105 is covered with a protective film 106 composed of a water-soluble resin (e.g., polyvinyl alcohol resin), a fluorine-based resin, or the like which causes low damage to an organic semiconductor material (regarding the above, for example, refer to Document 1 (C. D. Sheraw et al., "Applied Physics Letters", 2002, VOLUME 80, NUMBER 6, pp. 1088-1090)).

Meanwhile, the water-soluble resin or the fluorine-based resin constituting the protective film 106 causes low damage to an organic semiconductor material, but has low adhesion to the other layers. Consequently, delamination easily occurs at the interface between the protective film 106 and the source 104s/drain 104d or the gate-insulating film 103 which is an underlying layer, or wiring detachment occurs when wiring is directly disposed on the protective film 106, thus reducing mechanical reliability, which makes it impossible to obtain sufficient yield.

Under these circumstances, a configuration has been proposed, in which, as shown in FIG. 15, the area of the protective film 106 is decreased by patterning the protective film 106 so as to have the same pattern as the organic semiconductor layer 105, thus minimizing the size of the interface between the protective film 106 and the source 104s/drain 104d or the gate-insulating film 103 which is an underlying layer, so that delamination between the protective film 106 and layers in contact therewith can be prevented.

DISCLOSURE OF INVENTION

However, as shown in FIG. 15, in the configuration in which the protective film 106 is disposed only on the top of the organic semiconductor layer 105, side edges of the organic semiconductor layer are in an exposed state. Therefore, the organic semiconductor layer 105 constituting the channel portion is damaged by the solvent used in the subsequent insulating film formation process, resulting in degradation of characteristics of the organic thin film transistor.

Accordingly, it is an object of the present invention to provide a semiconductor device and a display, in which, while an organic semiconductor layer is sufficiently protected by a protective film, it is possible to prevent delamination at the interface between the protective film and an underlying layer (a source/drain, a gate-insulating film, a substrate, or the like) in contact with the protective film, thereby achieving good characteristics and improving yield due to improvement in mechanical reliability.

In order to achieve the object, the present invention is characterized by including an organic semiconductor layer formed by patterning on a substrate, and a protective film formed by patterning on the substrate in such a state as to cover an exposed surface including a side wall of the organic semiconductor layer.

Furthermore, the present invention provides a display using the semiconductor device having the configuration described above. The display has a configuration in which a pixel electrode is connected to a thin film transistor which uses an organic semiconductor layer as a semiconductor layer of a channel portion.

In the semiconductor device having such a configuration and the display using the semiconductor device, since the exposed surface including the side wall of the organic semiconductor layer is covered with the protective film, the organic semiconductor layer is securely protected by the protective film. Meanwhile, since the protective film is a patterned structure, the area of the interfaces in contact with other layers is reduced, and delamination at the protective film interface can be prevented.

Furthermore, according to the present invention, in the configuration described above, an insulating partition wall having an opening may be further disposed on the substrate, the organic semiconductor layer may be disposed, in a state of being divided by the partition wall, on the bottom of the opening of the partition wall, and the protective film may be disposed in such a state as to fill the inside of the opening of the partition wall. Thereby, the organic semiconductor layer is more securely protected by the partition wall and the protective film filling the opening.

BEST MODES FOR CARRYING OUT THE INVENTION

The embodiments of the present invention will be described in detail below with reference to the drawings. Note that in each embodiment, the embodiment will be described with respect to the configuration of a semiconductor device, a method of manufacturing the semiconductor device, and a display using the semiconductor device in that order.

First Embodiment

<Configuration of Semiconductor Device>

Figure 1:
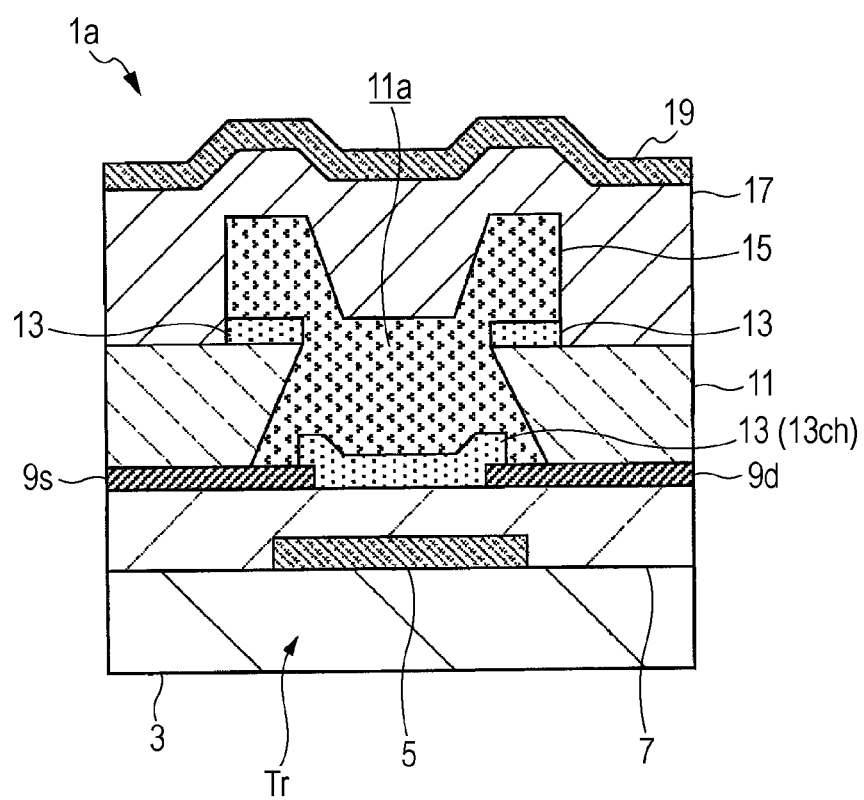
FIG. 1 is a cross-sectional view illustrating a semiconductor device according to a first embodiment.

A semiconductor device 1a shown in FIG. 1 includes a bottom-gate-bottom-contact-type thin film transistor. In the semiconductor device 1a shown in this drawing, a gate electrode 5 composed of a conductive material is formed by patterning on a substrate 3. A gate-insulating film 7 is formed above the substrate 3 in such a state as to cover the gate electrode 5. On the gate-insulating film 7, a pair of a source electrode 9s and a drain electrode 9d composed of a conductive material are formed by patterning at both sides sandwiching the gate electrode 5.

A partition wall 11 composed of an insulating material is disposed above the substrate 3 provided with the source electrode 9s and the drain electrode 9d. An opening 11a is provided in the partition wall 11, the opening 11a exposing therethrough the surface of the gate-insulating film 7 between the source electrode 9S and the drain electrode 9d and ends of the source electrode 9S and the drain electrode 9d located on the sides thereof.

Furthermore, on the substrate 3 provided with the partition wall 11, an organic semiconductor layer 13, which is divided by a side wall step of the partition wall 11, is formed by patterning on the bottom of the opening 11a of the partition wall 11. The organic semiconductor layer 13 is disposed in such a state that its edges are stacked on the source electrode 9S and the drain electrode 9d at the bottom of the opening 11a. Thus, a thin film transistor Tr is structured in which the organic semiconductor layer 13 serves as a channel portion semiconductor layer 13ch.

In addition, such an organic semiconductor layer 13 (channel portion semiconductor layer 13ch) is subjected to patterning by film formation from above the partition wall 11, as will be described in detail in the manufacturing process below. Therefore, there may be a case where the organic semiconductor layer 13 is also left on the top of the partition wall 11.

Furthermore, a protective film 15 is disposed on the substrate 3 provided with the organic semiconductor layer 13 in such a state as to fill the inside of the opening 11a of the partition wall 11. The protective film 15 is composed of an organic material and, in particular, is constituted using a material that can be formed without affecting the organic semiconductor material constituting the organic semiconductor layer 13, such as a fluorine-based resin, a water-soluble resin, or a poly(para-xylylene) derivative. Furthermore, preferably, the circumferential edge portion of the protective film 15 is disposed on the partition wall 11 and the edge of the opening 11a of the partition wall 11 is completely covered with the protective film 15. In addition, when the organic semiconductor layer 13 is left on the partition wall 11, the organic semiconductor layer 13 is left in a state of being patterned so as to have the same outer circumferential shape as the protective film 15.

The substrate 3 provided with the protective film 15 as described above is covered with an interlayer insulating film 17, and a conductive pattern 19, such as interconnect lines, is disposed on the interlayer insulating film 17.

<Method of Manufacturing Semiconductor Device>

Figure 2:
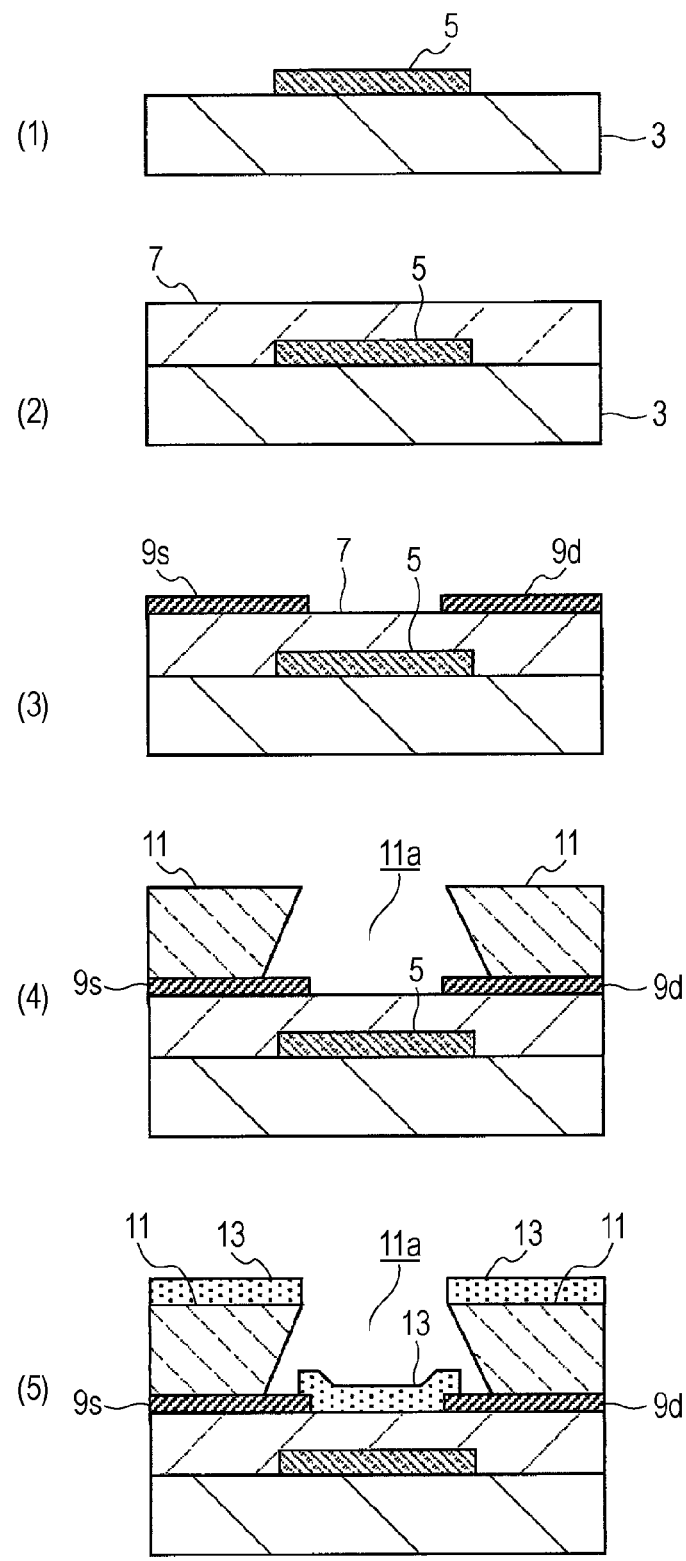
FIG. 2 is a cross-sectional process chart (1) illustrating a method of manufacturing a semiconductor device according to the first embodiment.
Figure 3:
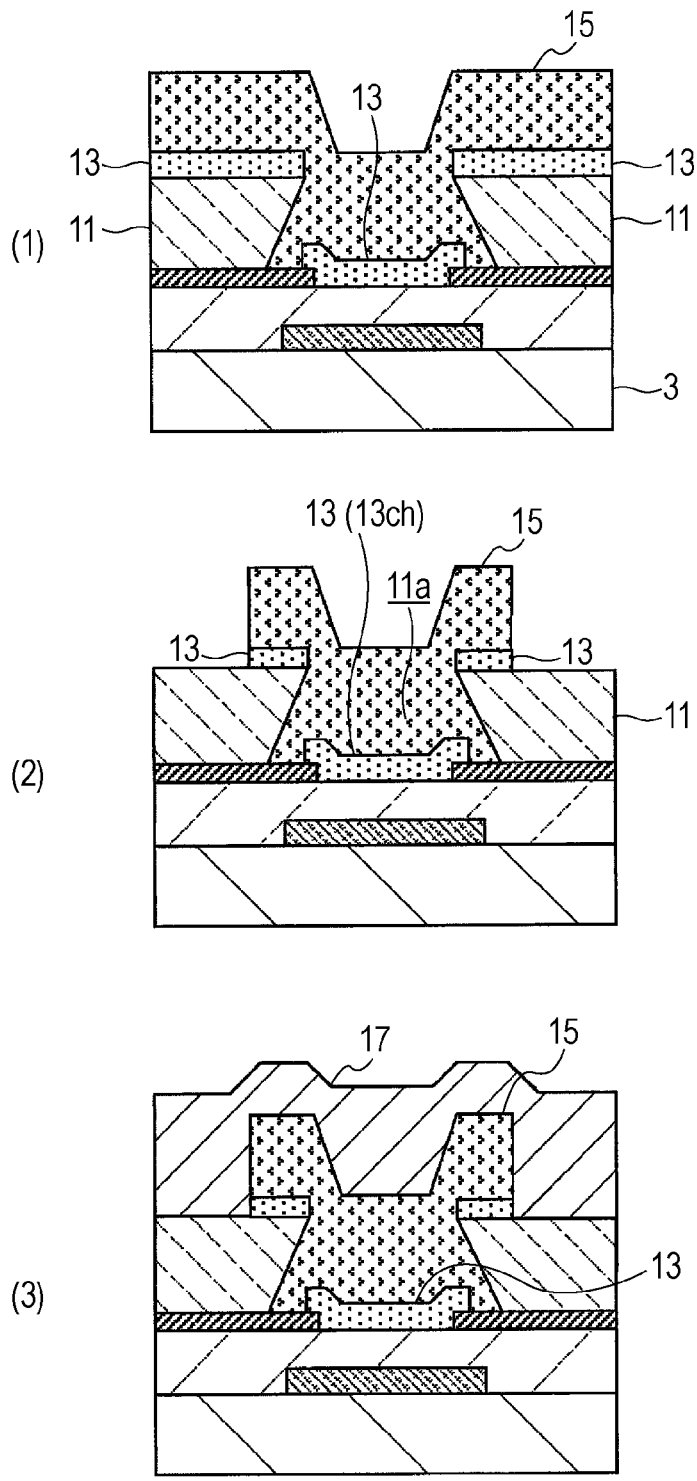
FIG. 3 is a cross-sectional process chart (2) illustrating a method of manufacturing a semiconductor device according to the first embodiment.

FIGS. 2 and 3 are manufacturing process charts showing the procedure for manufacturing a semiconductor device 1a having the configuration described above. Next, the procedure for manufacturing the semiconductor device 1a will be described according to the drawings.

First, as shown in FIG. 2(1), an insulating substrate 3 is prepared. The material for the substrate 1 is not particularly limited as long as the outermost surface has insulating properties, and may be glass or a plastic material which flexibly bends.

Next, a gate electrode 5 composed of Au is formed by patterning on the substrate 3. Here, for example, the gate electrode 5 is formed by patterning by a lift-off process using a resist pattern formed by a lithographic method. In addition, the gate electrode 5 formed here is not limited to the one composed of Au. The gate electrode 5 may be composed of another metal material, such as Al, Ti, Cr, Ag, or Pt; a metal-dispersed material, such as silver paste; or a conductive polymer, such as PEDOT/PSS [poly(3,4-ethylenedioxythiophene)/poly(4-styrene sulfonate)] or polyaniline. Furthermore, the formation by patterning of the gate electrode 5 is not limited to the lift-off process, and may be performed by a vapor deposition method using a shadow mask, a method in which, using a resist pattern formed by a lithographic method as a mask, a conductive film is subjected to pattern etching, or a printing method. Note that the lithographic method may be either photolithography or electron-beam lithography.

Next, as shown in FIG. 2(2), a gate-insulating film 7 is formed in such a state as to cover the gate electrode 5. Here, for example, a gate-insulating film 7 composed of polyvinylphenol is formed by a spin-coating method. In addition, the material constituting the gate-insulating film 7 is not limited to polyvinylphenol, and may be a material that has insulating properties, for example, another organic insulating material, such as polyimide or polymethyl methacrylate; an inorganic insulating film, such as $SiO_2$, SiN, or $Al_2O_3$; or a composite material of an organic material and an inorganic material. Furthermore, the formation of the gate-insulating film 7 is not limited to the spin-coating method, and an appropriate film formation method suitable for the material may be selected from printing techniques, such as stamping, ink-jet, slit-coating, cap-coating, and screen printing; a vapor deposition method; a sputtering method; a CVD method; and others.

Next, as shown in FIG. 2(3), a source electrode 9s and a drain electrode 9d composed of Au are formed by patterning on the gate-insulating film 7. Here, for example, the source electrode 9s and the drain electrode 9d are formed by patterning by a lift-off process using a resist pattern formed by a lithographic method. In addition, the source electrode 9s and the drain electrode 9d are not limited to those composed of Au, as in the gate electrode 5, and the same material as that for the gate electrode 5 can be used. Furthermore, the formation by patterning of the source electrode 9s and the drain electrode 9d is not limited to the lift-off process, as in the gate electrode 5, and the same method as that for the gate electrode 5 can be used.

Then, as shown in FIG. 2(4), an insulating partition wall 11 having an opening 11a is formed above the substrate 3. Here, for example, the partition wall 11 is formed by subjecting an insulating film formed by a spin-coating method to patterning using a lithographic method. It is important that the partition wall 11 has a structure which allows an organic semiconductor layer subsequently formed to be divided by the side wall step of the opening 11a of the partition wall 11 so that patterning can be performed.

Consequently, in the case where the subsequently formed organic semiconductor layer is an evaporated film, the side wall of the opening 11a is formed so as to have a reverse-tapered shape. In this case, by performing a lithographic process using a negative resist (e.g., TELR-N101PM: trade name manufactured by Tokyo Ohka Kogyo Co., Ltd.) as the insulating film formed by the spin-coating method, the reverse-tapered shape of the opening 11a is realized.

Furthermore, in the case where the subsequently formed organic semiconductor layer is a coating film, by forming a partition wall 11 composed of a water-repellent insulating material or an oil-repellent insulating material depending on the coating liquid to be used for coating to be used, the organic semiconductor layer is formed by patterning only inside the opening 11a. In this case, the side wall of the opening 11a may have either a forward-tapered shape or a reverse-tapered shape.

In addition, regarding the formation position of the opening 11a, as described with reference to FIG. 1, the opening 11a is formed on the surface of the gate-insulating film 7 between the source electrode 9S and the drain electrode 9d, and the exposed ends of the source electrode 9S and the drain electrode 9d located on the sides thereof. Furthermore, although omitted in the drawing, as necessary, a plurality of openings, such as a second opening and a third opening extending to the source electrode 9S or the drain electrode 9d may be provided in the partition wall 11. Thereby, the second opening, the third opening, and the like can be used as connecting holes for the upper interconnect lines.

Subsequently, as shown in FIG. 2(5), a channel portion semiconductor layer 13a, which is formed by subjecting the organic semiconductor layer 13 to patterning, is disposed inside the opening 11a of the partition wall 11 in such a shape as to be connected to the source electrode 9S and the drain electrode 9dt at the two ends. Here, for example, an organic semiconductor layer 13 composed of pentacene is formed by vapor deposition so as to correspond to the partition wall 11 having an opening 11a, the side wall of which is in a reverse-tapered shape. Thus, the organic semiconductor layer 13 divided by the side wall step of the partition wall 11 is formed. Thereby, the organic semiconductor layer 13 is also formed on the top of the partition wall 11.

In addition, the organic semiconductor material constituting the organic semiconductor layer 13 is not limited to pentacene, and anthracene, phthalocyanine, porphyrin, thiophene-based polymers, and derivatives thereof may also be used. Furthermore, here, the formation of the organic semiconductor layer 13 is not limited to the vacuum deposition method, and any method which allows formation by patterning of the organic semiconductor layer 13 serving as the channel portion semiconductor layer 13a inside the opening 11a of the partition wall 11 may be used. A method using a coating liquid, such as stamping, screen printing, cap-coating, ink-jet, slit-coating, or a spin-coating method, may be used.

By the steps described above, a bottom-gate-bottom-contact-type thin film transistor Tr in which the channel portion semiconductor layer 13ch is disposed at the bottom of the opening 11a is formed.

Next, as shown in FIG. 3(1), a protective film 15 composed of an organic material is formed on the substrate 3 provided with the organic semiconductor layer 13. Here, it is important to form the protective film 15 such that all of the exposed surfaces including the side wall of the organic semiconductor layer 13 (13ch) disposed in the opening 11a of the partition wall 11 are covered with the protective film 15.

Furthermore, as the material constituting the protective film 15, it is important to use an organic material which can be deposited without affecting the organic semiconductor material constituting the organic semiconductor layer 13.

Consequently, in the case where the protective film 15 is formed using a film formation method using a coating liquid, a fluorine-based resin such as Cytop (Cytop809M: trade name manufactured by Asahi Glass Co., Ltd.) or a water-soluble resin such as PVA, in which the solvent does not affect the organic semiconductor material, can be used as the material constituting the protective film 15. In addition, as the film formation method using a coating liquid, a spin-coating method or a printing technique, such as stamping, ink-jet, slit-coating, cap-coating, or screen printing, is conducted.

Furthermore, in the case where the protective film 15 is formed by the film forming method which does not use a coating liquid, i.e., a vapor deposition method, a sputtering method, or a CVD method, it is not necessary to take into consideration influence of a semiconductor solvent on the organic semiconductor layer 13. Examples of the organic material to which such a film forming method can be applied include poly(para-xylylene) derivatives.

Next, as shown in FIG. 3(2), the protective film 15 is subjected to patterning to a minimum size. In this step, for example, the protective film 15 is subjected to patterning such that the circumferential edge portion of the protective film 15 is disposed on the top of the partition wall 11 and the edge of the opening 11a of the partition wall 11 is completely covered with the protective film 15. Here, for example, the protective film 15 is subjected to patterning by RIE of the protective film 15 using as a mask a resist pattern formed by a lithographic method. In this case, when the protective film 15 is composed of Cytop, Az1500 (trade name manufactured by AZ Electronic Materials Ltd.) is used for the resist pattern. Furthermore, in the case where the organic semiconductor layer 13 is formed on the top of the partition wall 11, the organic semiconductor layer 13 on the top of the partition wall 11 is also subjected to patterning by the etching (RIE) simultaneously.

In addition, when the formation of the protective film 15 described with reference to FIG. 3(1) is performed by a stamping method, an ink-jet method, a screen printing method, or the like, in which the protective film 15 is formed by coating (including printing) in a pre-patterned state, this step can be omitted. However, when the organic semiconductor layer 13 is formed on the top of the partition wall 11, a step of removing by etching the organic semiconductor layer 13 on the top of the partition wall 11 using the protective film 15 as a mask is preferably carried out.

Subsequently, as shown in FIG. 3(3), an interlayer insulating film 17 is formed in such a state as to cover the protective film 15 which has been subjected to patterning. Here, it may be possible to form an interlayer insulating film 17 having connecting holes (omitted in the drawing) at predetermined parts, for example, by a lithographic method using a photosensitive resist material (TELR-P003PM: trade name manufactured by Tokyo Ohka Kogyo Co., Ltd.). When connecting holes are provided, the connecting holes are provided in a second opening and a third opening formed in the partition wall 11. Furthermore, in this case, coating of the resist material is performed, for example, using a spin-coating method.

In addition, the material constituting the interlayer insulating film 17 is not limited to a photosensitive resist material, and may be a material that has insulating properties, for example, another organic insulating material, such as polyvinylphenol, polyimide, or polymethyl methacrylate; an inorganic insulating film, such as $SiO_2$, SiN, or $Al_2O_3$; or a composite material of an organic material and an inorganic material. Furthermore, the formation of the interlayer insulating film 17 is not limited to the spin-coating method, and an appropriate film formation method suitable for the material may be selected from printing techniques, such as stamping, ink-jet, slit-coating, cap-coating, and screen printing; a vapor deposition method; a sputtering method; a CVD method; and others. In this case, as necessary, connecting holes may be formed when the interlayer insulating film 17 is formed. Alternatively, in the method in which formation is performing by coating (including printing) in a pre-patterned state, such as a stamping method, an ink-jet method, or a screen printing method, as necessary, the interlayer insulating film 17 may be formed in a shape having connecting holes.

Subsequently, as shown in FIG. 1, a conductive pattern 19 composed of Cu is formed on the interlayer insulating film 17. Here, for example, a Cu film formed by a vacuum deposition method is subjected to etching using as a mask a resist pattern formed by a lithographic method, thereby to form the conductive pattern 19. In addition, the conductive pattern 19 is not limited to the one composed of Cu. As in the gate electrode 5, the source electrode 9s, and the drain electrode 9d, the conductive pattern 19 may be composed of another metal material, such as Ti, Cr, Ag, Al, or Pt; a metal-dispersed material, such as silver paste; or a conductive polymer, such as PEDOT/PSS [poly(3,4-ethylenedioxythiophene)/poly(4-styrene sulfonate)] or polyaniline. Furthermore, the formation by patterning of the conductive pattern 19 may be performed by a vapor deposition method using a shadow mask, or a printing method. Note that the lithographic method may be either photolithography or electron-beam lithography.

By the steps described above, a semiconductor device 1a provided with the bottom-gate-bottom-contact-type thin film transistor Tr described with reference to FIG. 1 is obtained.

In the semiconductor device 1a thus obtained, the channel portion semiconductor layer 13ch is more securely protected by the partition wall 11 and the protective film 13 which fills the opening 11a thereof. Therefore, influence during formation of the interlayer insulating film 17 thereon and formation of the conductive pattern 19 further thereon does not reach the channel portion semiconductor layer 13c, and the film quality of the channel portion semiconductor layer 13c is secured. Thus, it is possible to obtain a thin film transistor Tr having good characteristics. Moreover, since the protective film 15 is a patterned structure, the area of the interfaces in contact with other layers is reduced, delamination at the protective film 15 interface can be prevented, and mechanical reliability is also secured.

As a result, in the semiconductor device 1a, while good device characteristics are obtained, mechanical reliability is improved, and the yield can be improved.

<Display>

Figure 4:
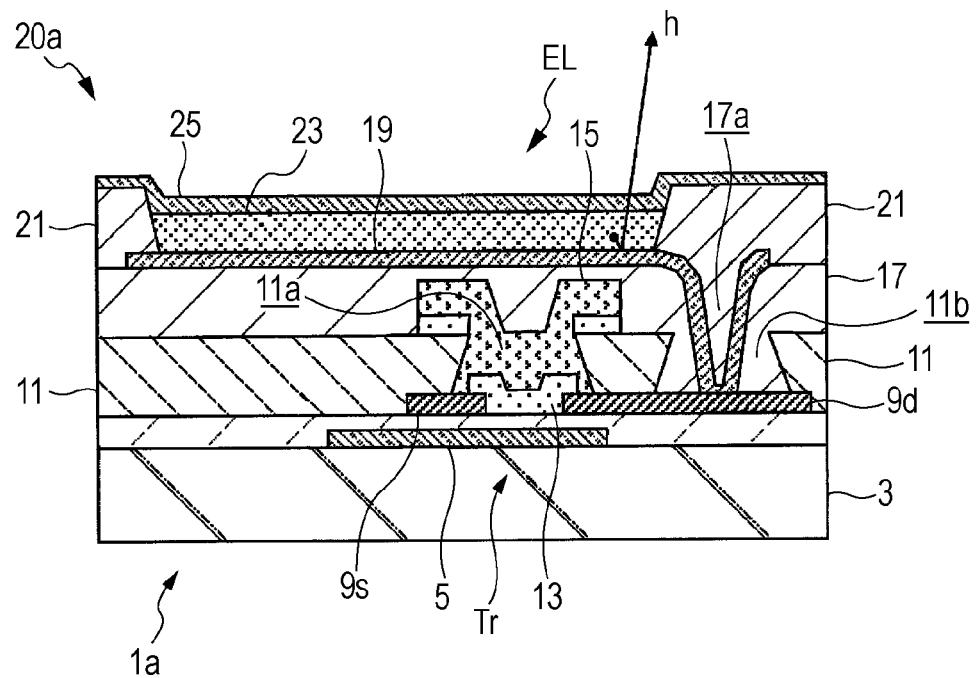
FIG. 4 is a cross-sectional view illustrating a display using a semiconductor device according to the first embodiment.

FIG. 4 is a schematic cross-sectional view showing an example of a configuration of each pixel of a display 20a structured using the semiconductor device 1a shown in FIG. 1. Next, the configuration of the display 20a will be described with reference to this drawing.

The display 20a shown in this drawing is an organic EL display having an organic electroluminescence device EL for each pixel. In this case, a thin film transistor Tr formed on a substrate 3 constitutes a pixel circuit for driving the organic electroluminescence device EL and is provided for each pixel. Furthermore, the conductive pattern 19 of the semiconductor device 1a is formed by patterning as a pixel electrode 19 for each pixel.

Here, the pixel electrode 19 is used, for example, as an anode (or a cathode), and is preferably composed of a material having reflecting properties. Each pixel electrode 19 is connected to a drain electrode 9d through a connecting hole 17a formed in an interlayer insulating film 17 inside a second opening 11b provided in a partition wall 11. In addition, preferably, the interlayer insulating film 17 is formed as a planarizing insulating film.

Furthermore, an insulating pattern 21 having a shape that covers the circumferential edge of the pixel electrode 19 is disposed on the top of the interlayer insulating film 17, and the pixel electrode 19 portion exposed from the insulating pattern 21 corresponds to a pixel opening. An organic EL layer is formed by patterning in such a state as to completely cover the exposed surface of the pixel electrode 19 in the pixel opening. The organic EL layer 23 is configured to have a laminated structure which includes at least a luminescent layer and in which a hole transport layer, a hole injection layer, and the like are disposed on the anode side of the luminescent layer according to need, and an electron transport layer, an electron injection layer, and the like are disposed on the luminescent cathode side according to need. Furthermore, a counter electrode 25 common to all the pixels is disposed, as a cathode (or an anode), in a solid film state on the organic EL layer 23, and an organic electroluminescence device EL is formed at a portion in which the organic EL layer 23 is sandwiched between the pixel electrode 19 and the counter electrode 25.

In the display 20a having such a configuration, since the semiconductor device 1a configured to have the protective film 15 as described above is used, a display having good characteristics is realized by the semiconductor device 1a (thin film transistor Tr) having good characteristics, and mechanical reliability can be improved to a large extent.

Second Embodiment

<Configuration of Semiconductor Device>

Figure 5:
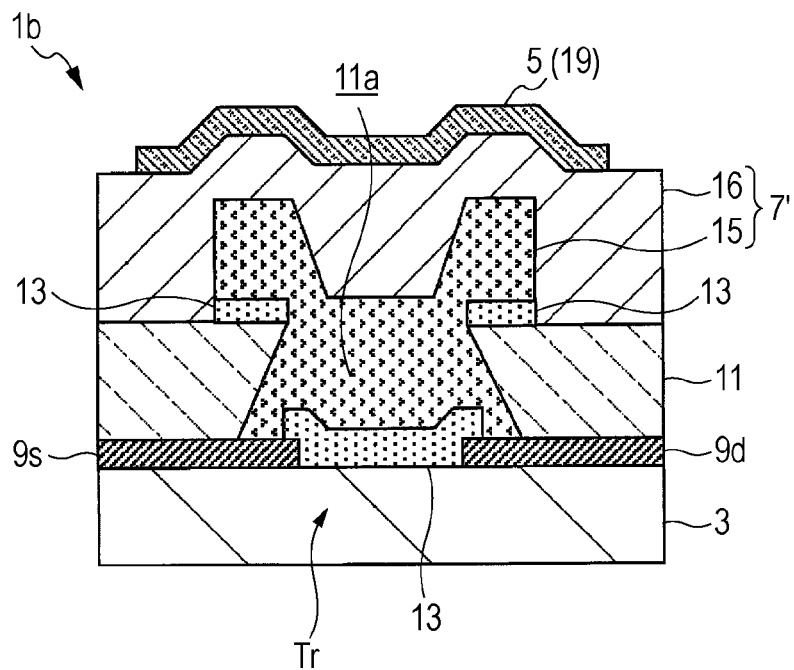
FIG. 5 is a cross-sectional view illustrating a semiconductor device according to a second embodiment.

A semiconductor device 1b according to a second embodiment shown in FIG. 5 includes a top-gate-bottom-contact-type thin film transistor Tr'. The semiconductor device 1b shown in this drawing differs from the semiconductor device 1a according to the first embodiment described with reference to FIG. 1 in that the gate electrode 5 is disposed on the top of the insulating film 16 which covers the protective film 15, and the other configuration is the same as that of the first embodiment.

That is, the insulating film 16 is disposed in such a state as to cover the protective film 15, and the protective film 15 and the insulating film 16 constitute a gate-insulating film 7'. The gate electrode 5 composed of a conductive pattern is disposed on the gate-insulating film 7'.

Consequently, the second embodiment is the same as the first embodiment in that a pair of the source electrode 9s and the drain electrode 9d are formed by patterning on the top of the substrate 3, the partition wall 11 is disposed on the top thereof, the organic semiconductor layer 13 divided by the side wall step of the partition wall 11 is formed by patterning on the bottom of the opening 11a of the partition wall 11, and the thin film transistor Tr is structured in which the organic semiconductor layer 13 serves as the channel portion semiconductor layer 13ch.

Furthermore, the second embodiment is also the same as the first embodiment in that the protective film 15 is disposed on the substrate 3 provided with the organic semiconductor layer 13 in such a state as to fill the inside of the opening 11a of the partition wall 11. That is, the protective film 15 is composed of an organic material and, in particular, is constituted using a material that can be formed without affecting the organic semiconductor material constituting the organic semiconductor layer 13, such as a fluorine-based resin, a water-soluble resin, or a poly(para-xylylene) derivative. Furthermore, preferably, the circumferential edge portion of the protective film 15 is disposed on the partition wall 11 and the edge of the opening 11a of the partition wall 11 is completely covered with the protective film 15. In addition, when the organic semiconductor layer 13 is left on the partition wall 11, the organic semiconductor layer 13 is left in a state of being patterned so as to have the same outer circumferential shape as the protective film 15.

The substrate 3 provided with the protective film 15 as described above is covered with the insulating film 16 which, together with the protective film 15, constitutes a part of the gate-insulating film 7', and the gate electrode 5 composed of the conductive pattern is disposed on the insulating film 17'.

<Method of Manufacturing Semiconductor Device>

Figure 6:
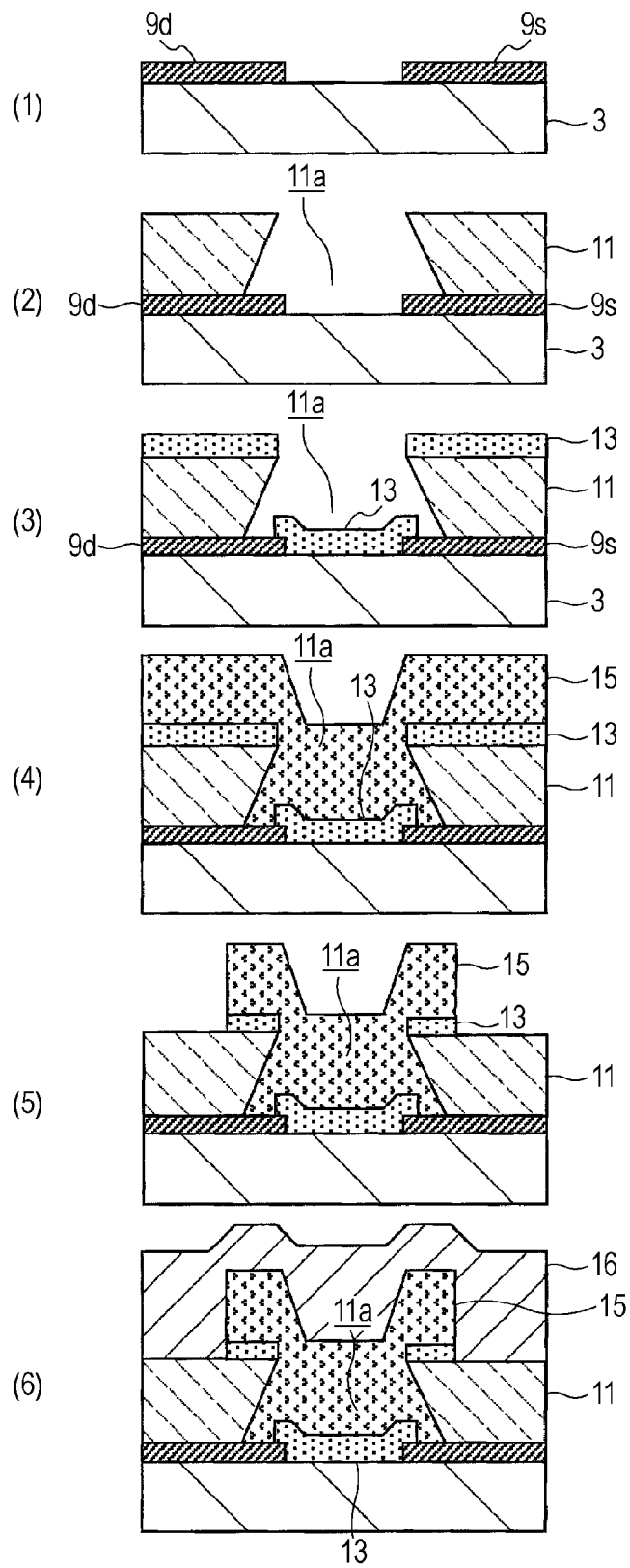
FIG. 6 is a cross-sectional process chart illustrating a method of manufacturing a semiconductor device according to the second embodiment.

FIG. 6 is a manufacturing process chart showing the procedure for manufacturing a semiconductor device 1b having the configuration described above. Next, the procedure for manufacturing the semiconductor device 1b will be described according to the drawings. Note that here, the steps described in the first embodiment with reference to FIGS. 2(3) to 3(3) are carried out in the same manner.

That is, first, as shown in FIG. 6(1), an insulating substrate 3 is prepared. The material for the substrate 1 is not particularly limited as long as the outermost surface has insulating properties, and may be glass or a plastic material which flexibly bends.

Next, a source electrode 9s and a drain electrode 9d composed of Au are formed by patterning on the substrate 3. This step is carried out in the same manner as that described in the first embodiment with reference to FIG. 2(3). For example, the source electrode 9s and the drain electrode 9d are formed by patterning by a lift-off process using a resist pattern formed by a lithographic method. In addition, the source electrode 9s and the drain electrode 9d formed here are not limited to the ones composed of Au, and may be composed of another metal material, such as Al, Ti, Cr, Ag, or Pt; a metal-dispersed material, such as silver paste; or a conductive polymer, such as PEDOT/PSS [poly(3,4-ethylenedioxythiophene)/poly(4-styrene sulfonate)] or polyaniline. Furthermore, the formation by patterning of the source electrode 9s and the drain electrode 9d is not limited to the lift-off process, and may be performed by a vapor deposition method using a shadow mask, a method in which, using a resist pattern formed by a lithographic method as a mask, a conductive film is subjected to pattern etching, or a printing method. Note that the lithographic method may be either photolithography or electron-beam lithography.

Then, as shown in FIG. 6(2), an insulating partition wall 11 having an opening 11a is formed above the substrate 3. This step is carried out in the same manner as that described in the first embodiment with reference to FIG. 2(4), and it is important that the partition wall 11 has a structure which allows an organic semiconductor layer subsequently formed to be divided by the side wall step of the opening 11a of the partition wall 11 so that patterning can be performed. Furthermore, the formation position of the opening 11a to be formed in the partition wall 11 and the fact that a plurality of openings, such as a second opening and a third opening, which extend to the source electrode 9S and the drain electrode 9d (omitted in the drawing), may be formed are the same as those in the first embodiment.

Next, as shown in FIG. 6(3), a channel portion semiconductor layer 13a, which is formed by subjecting the organic semiconductor layer 13 to patterning, is disposed inside the opening 11a of the partition wall 11 in such a shape as to be connected to the source electrode 9S and the drain electrode 9dt at the two ends. This step is carried out in the same manner as that described in the first embodiment with reference to FIG. 2(5).

Next, as shown in FIG. 6(4), a protective film 15 composed of an organic material is formed on the substrate 3 provided with the organic semiconductor layer 13. This step is carried out in the same manner as that described in the first embodiment with reference to FIG. 3(1). That is, here, it is important to form the protective film 15 such that all of the exposed surfaces including the side wall of the organic semiconductor layer 13 (13ch) disposed in the opening 11a of the partition wall 11 are covered with the protective film 15. Furthermore, as the material constituting the protective film 15, it is important to use an organic material which can be deposited without affecting the organic semiconductor material constituting the organic semiconductor layer 13.

Next, as shown in FIG. 6(5), the protective film 15 is subjected to patterning to a minimum size. This step is carried out in the same manner as that described in the first embodiment with reference to FIG. 3(2). That is, for example, the protective film 15 is subjected to patterning such that the circumferential edge portion of the protective film 15 is disposed on top of the partition wall 11 and the edge of the opening 11a of the partition wall 11 is completely covered with the protective film 15. In addition, as in the first embodiment, in the case where the protective film 15, which is described with reference to FIG. 6(4), is formed by coating (including printing) in a pre-patterned state, this step can be omitted.

Next, as shown in FIG. 6(6), an insulating film 6 is formed in such a state as to cover the protective film 15 which has been subjected to patterning. This step is carried out in the same manner as that described in the first embodiment with reference to FIG. 3(3). However, the insulating film 16 formed here, together with the protective film 15, constitutes a gate-insulating film 7'. Consequently, the insulating film 16 is formed with a material and thickness that are suitable for constituting a part of the gate-insulating film 7'.

Subsequently, as shown in FIG. 5, a conductive pattern composed of Cu is formed as a gate electrode 5 on the insulating film 16 (gate-insulating film 7'). Here, for example, a Cu film formed by a vacuum deposition method is subjected to etching using as a mask a resist pattern formed by a lithographic method, thereby to form the gate electrode 5. In addition, the gate electrode 5 is not limited to the one composed of Cu. The gate electrode 5 may be composed of another metal material, such as Ti, Cr, Ag, Al, or Pt; a metal-dispersed material, such as silver paste; or a conductive polymer, such as PEDOT/PSS [poly(3,4-ethylenedioxythiophene)/poly(4-styrene sulfonate)] or polyaniline. Furthermore, the formation by patterning of the gate electrode 5 may be performed by a vapor deposition method using a shadow mask, or a printing method. Note that the lithographic method may be either photolithography or electron-beam lithography.

By the steps described above, a semiconductor device 1b provided with the top-gate-bottom-contact-type thin film transistor Tr' in which the channel portion semiconductor layer 13ch is disposed at the bottom of the opening 11a is obtained.

In the semiconductor device 1b according to the second embodiment thus obtained, the channel portion semiconductor layer 13ch is also more securely protected by the partition wall 11 and the protective film 13 which has been subjected to patterning in such a state as to fill the opening 11a thereof. Therefore, as in the first embodiment, in the semiconductor device 1b, while good device characteristics are obtained, mechanical reliability is improved, and the yield can be improved.

<Display>

Figure 7:
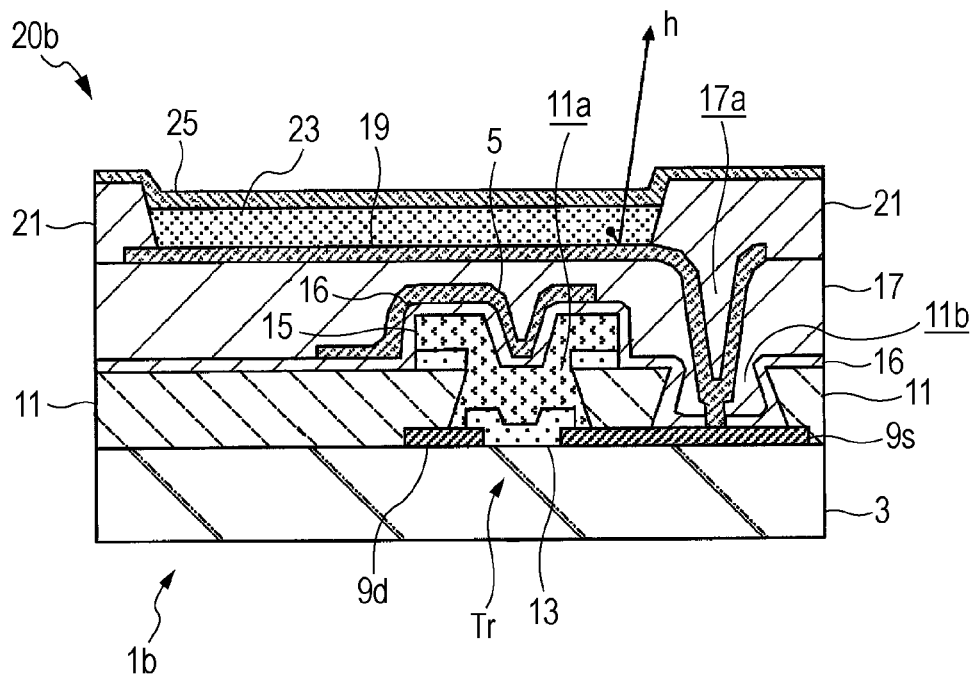
FIG. 7 is a cross-sectional view illustrating a display using a semiconductor device according to the second embodiment.

FIG. 7 is a schematic cross-sectional view showing an example of a configuration of each pixel of a display 20b configured using the semiconductor device 1b shown in FIG. 1. Next, the configuration of the display 20b will be described with reference to this drawing.

The display 20b shown in this drawing is an organic EL display having an organic electroluminescence device EL for each pixel. In this case, a thin film transistor Tr' formed on a substrate 3 constitutes a pixel circuit for driving the organic electroluminescence device EL and is provided for each pixel.

Furthermore, the interlayer insulating film 17 is disposed in such a state as to cover the thin film transistor Tr', and a pixel electrode 19 is formed by patterning on the interlayer insulating film 17 for each pixel.

Here, the pixel electrode 19 is used, for example, as an anode (or a cathode), and is preferably composed of a material having reflecting properties. Each pixel electrode 19 is connected to a drain electrode 9d through a connecting hole 17a formed in an interlayer insulating film 17 inside a second opening 11b provided in a partition wall 11. In addition, preferably, the interlayer insulating film 17 is formed as a planarizing insulating film.

Furthermore, an insulating pattern 21 having a shape that covers the circumferential edge of the pixel electrode 19 is disposed on the top of the interlayer insulating film 17, and the pixel electrode 19 portion exposed from the insulating pattern 21 corresponds to a pixel opening. An organic EL layer is formed by patterning in such a state as to completely cover the exposed surface of the pixel electrode 19 in the pixel opening. The organic EL layer 23 is configured to have a laminated structure which includes at least a luminescent layer and in which a hole transport layer, a hole injection layer, and the like are disposed on the anode side of the luminescent layer according to need, and an electron transport layer, an electron injection layer, and the like are disposed on the luminescent cathode side according to need. Furthermore, a counter electrode 25 common to all the pixels is disposed, as a cathode (or an anode), in a solid film state on the organic EL layer 23, and an organic electroluminescence device EL is formed at a portion in which the organic EL layer 23 is sandwiched between the pixel electrode 19 and the counter electrode 25.

In the display 20b having such a configuration, since the semiconductor device 1b configured to have the protective film 15 as described above is used, a display having good characteristics is also realized by the semiconductor device 1b (thin film transistor Tr) having good characteristics, and mechanical reliability can be improved to a large extent.

Third Embodiment

<Configuration of Semiconductor Device>

Figure 8:
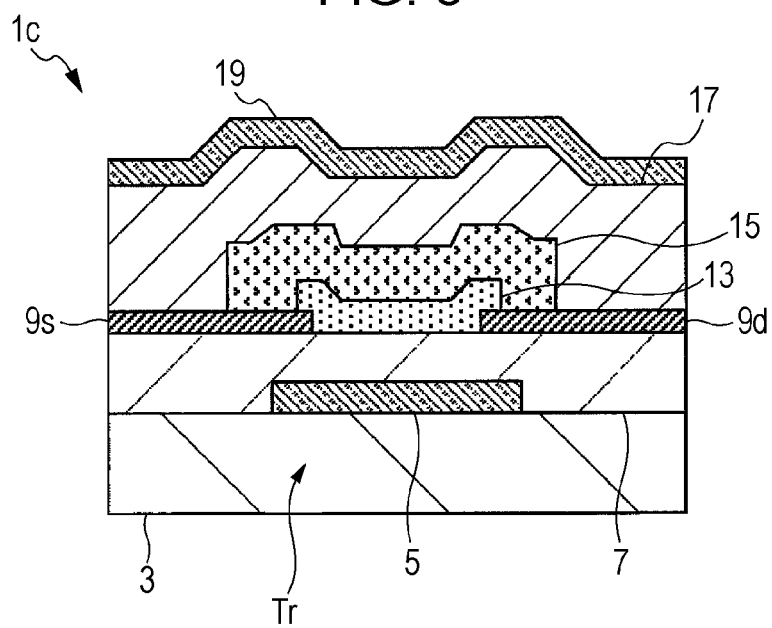
FIG. 8 is a cross-sectional view illustrating a semiconductor device according to a third embodiment.

A semiconductor device 1c according to a third embodiment shown in FIG. 8 includes a bottom-gate-bottom-contact-type thin film transistor Tr. The semiconductor device 1c shown in this drawing differs from the semiconductor device 1a according to the first embodiment described with reference to FIG. 1 in that the partition wall 11 is not disposed, and the other configuration is the same as that of the first embodiment.

That is, the semiconductor device 1c shown in FIG. 1 includes a bottom-gate-bottom-contact-type thin film transistor tr. In the semiconductor device 1c shown in this drawing, a gate electrode 5 composed of a conductive material is formed by patterning on a substrate 3. A gate-insulating film 7 is formed on the substrate 3 in such a state as to cover the gate electrode 5. On the gate-insulating film 7, a pair of a source electrode 9s and a drain electrode 9d composed of a conductive material are formed by patterning at both sides sandwiching the gate electrode 5.

An organic semiconductor layer 13 is formed by patterning above the substrate 3 provided with the source electrode 9s and the drain electrode 9d. The organic semiconductor layer 13 is disposed in such a state that its edges are stacked on the source electrode 9S and the drain electrode 9d. Thus, a thin film transistor Tr is structured in which the organic semiconductor layer 13 serves as a channel portion semiconductor layer 13ch.

Furthermore, a protective film 15 is formed by patterning, in such a state as to completely cover the exposed surface including the side wall of the organic semiconductor layer 13, on the substrate 3 provided with the organic semiconductor layer 13. The protective film 15 is composed of an organic material and, in particular, is constituted using a material that can be formed without affecting the organic semiconductor material constituting the organic semiconductor layer 13, such as a fluorine-based resin, a water-soluble resin, or a poly(para-xylylene) derivative.

The substrate 3 provided with the protective film 15 as described above is covered with an interlayer insulating film 17, and a conductive pattern 19, such as interconnect lines, is disposed on the interlayer insulating film 17.

<Method of Manufacturing Semiconductor Device>

In order to manufacture the semiconductor device 1c having the configuration described above, the steps in the first embodiment described with reference to FIGS. 2(1) to 3(3), excluding the formation of the partition wall described with reference to FIG. 2(4), are carried out.

However, in the formation of the organic semiconductor layer 13 described with reference to FIG. 2(5), it is not possible to subject the organic semiconductor layer 13 to patterning using the side wall step of the partition wall or using water repellency or hydrophobicity. Therefore, patterning is performed after the organic semiconductor layer 13 is formed, or an organic semiconductor layer 13 which has been pre-patterned using a printing method or the like is formed.

In the semiconductor device 1c according to the third embodiment thus obtained, the exposed surface including the side wall of the channel portion semiconductor layer 13ch is protected by the protective film 13 in which the size of the interface is minimized by patterning. Therefore, as in the first embodiment, in the semiconductor device 1c, while good device characteristics are obtained, mechanical reliability is improved, and thus the yield can be improved.

<Display>

Figure 9:
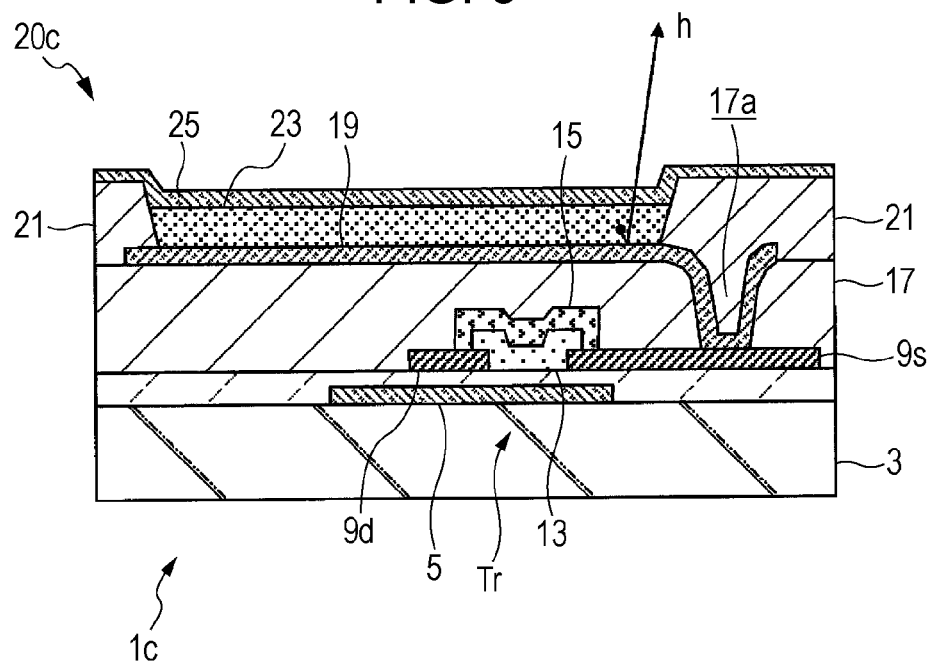
FIG. 9 is a cross-sectional view illustrating a display using a semiconductor device according to the third embodiment.

FIG. 9 is a schematic cross-sectional view showing an example of a configuration of each pixel of a display 20c constituted using the semiconductor device 1c shown in FIG. 8. The display 20c shown in this drawing differs from the display 20a according to the first embodiment described with reference to FIG. 4 in that the partition wall is not provided in the lower part of the interlayer insulating film 17 formed as a planarizing insulating film, and the other configuration is the same as that of the first embodiment. That is, the display 20c is an organic EL display having an organic electroluminescence device EL for each pixel. A thin film transistor Tr formed on a substrate 3 constitutes a pixel circuit for driving the organic electroluminescence device EL and is provided for each pixel. Furthermore, the conductive pattern 19 of the semiconductor device 1a is formed by patterning as a pixel electrode 19 for each pixel. Furthermore, the pixel electrode 19 is connected to a drain electrode 9d through a connecting hole 17a formed in an interlayer insulating film 17, and an organic EL layer 23 and a counter electrode 25 are stacked on the pixel electrode 19 to form an organic electroluminescence device EL.

In the display 20c having such a configuration according to the third embodiment, since the semiconductor device 1c configured to have the protective film 15 as described above is used, a display having good characteristics is also realized by the semiconductor device 1c (thin film transistor Tr) having good characteristics, and mechanical reliability can be improved to a large extent.

Modification Example

Figure 10:
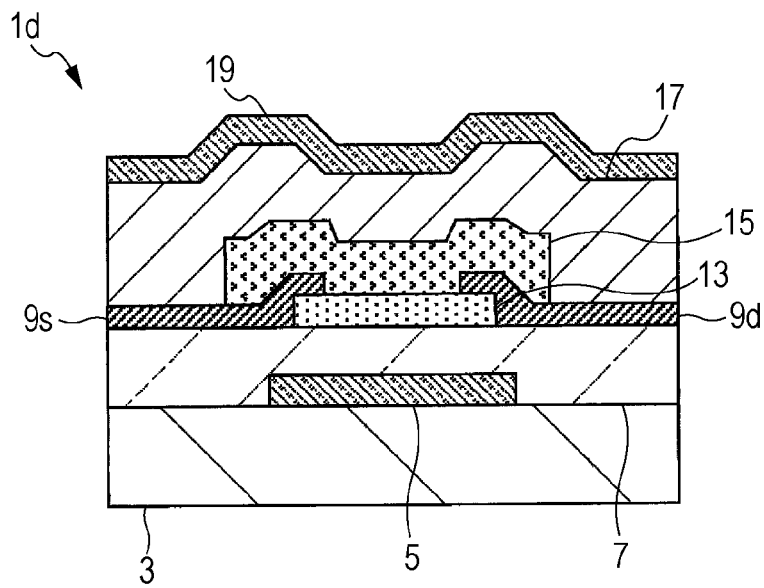
FIG. 10 is a cross-sectional view illustrating a modification example of a semiconductor device according to the third embodiment.

A semiconductor device 1d shown in FIG. 10 is a modification example of the third embodiment, and includes a bottom-gate-top-contact-type thin film transistor Tr". The semiconductor device 1d shown in this drawing differs from the semiconductor device 1c according to the third embodiment described with reference to FIG. 8 in that a source electrode 9s and a drain electrode 9d are disposed so as to overlap an organic semiconductor layer 13, and the other configuration is the same as that of a fourth embodiment.

In order to form such a semiconductor device 1d, in the procedure of the third embodiment, after the organic semiconductor layer 13 is formed, the source electrode 9s and the drain electrode 9d are formed.

Furthermore, the configuration of a display using such a semiconductor device 1d may be obtained by replacing the semiconductor device 1c in the display described with reference to FIG. 9 with the semiconductor device 1d.

In the configuration of the modification example described above, it is also possible to obtain the same advantages as those of the third embodiment.

Fourth Embodiment

<Configuration of Semiconductor Device>

Figure 11:
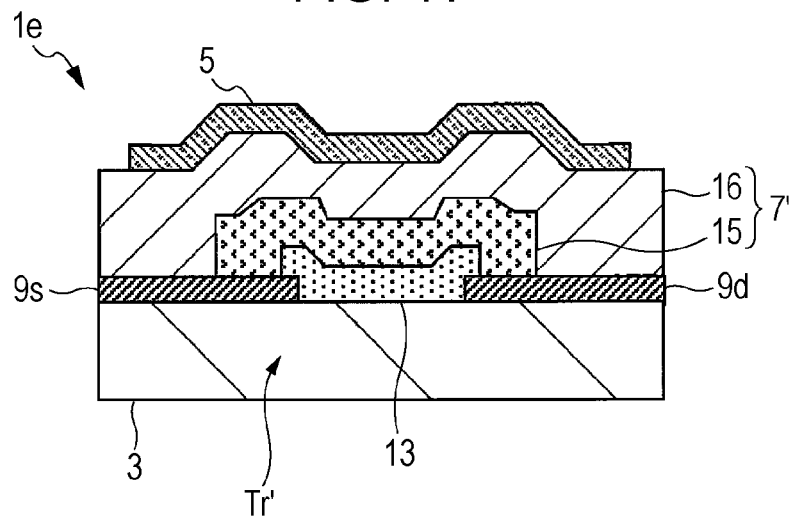
FIG. 11 is a cross-sectional view illustrating a semiconductor device according to a fourth embodiment.

A semiconductor device 1e according to a fourth embodiment shown in FIG. 11 includes a top-gate-bottom-contact-type thin film transistor Tr. The semiconductor device 1e shown in this drawing differs from the semiconductor device 1b according to the second embodiment described with reference to FIG. 5 in that the partition wall 11 is not disposed, and the other configuration is the same as that of the second embodiment.

That is, the semiconductor device 1e shown in FIG. 11 includes a top-gate-bottom-contact-type thin film transistor tr. In the semiconductor device 1e shown in this drawing, a pair of a source electrode 9s and a drain electrode 9d composed of a conductive material are formed by patterning on a substrate 3. An organic semiconductor layer 13 is formed by patterning above the substrate 3 provided with the source electrode 9s and the drain electrode 9d. The organic semiconductor layer 13 is disposed in such a state as that its edges are stacked on the source electrode 9S and the drain electrode 9d.

Furthermore, a protective film 15 is formed by patterning, in such a state as to completely cover the exposed surface including the side wall of the organic semiconductor layer 13, on the substrate 3 provided with the organic semiconductor layer 13. The protective film 15 is composed of an organic material and, in particular, is constituted using a material that can be formed without affecting the organic semiconductor material constituting the organic semiconductor layer 13, such as a fluorine-based resin, a water-soluble resin, or a poly(para-xylylene) derivative.

Furthermore, the substrate 3 provided with the protective film 15 is covered with an insulating film 16. The insulating film 16, together with the protective film 15, constitutes a gate-insulating film 7'. Furthermore, a gate electrode 5 composed of a conductive pattern is disposed on the gate-insulating film 7' having such a laminated structure.

<Method of Manufacturing Semiconductor Device>

In order to manufacture the semiconductor device 1e having the configuration described above, the steps in the second embodiment described with reference to FIGS. 6(1) to 6(6), excluding the formation of the partition wall described with reference to FIG. 6(2), are carried out.

However, in the formation of the organic semiconductor layer 13 described with reference to FIG. 6(3), it is not possible to subject the organic semiconductor layer 13 to patterning using the side wall step of the partition wall or using water repellency or hydrophobicity. Therefore, patterning is performed after the organic semiconductor layer 13 is formed, or an organic semiconductor layer 13 which has been pre-patterned using a printing method or the like is formed.

In the semiconductor device 1e according to the fourth embodiment thus obtained, the exposed surface including the side wall of the channel portion semiconductor layer 13ch is protected by the protective film 13 in which the size of the interface is minimized by patterning. Therefore, as in the first embodiment, in the semiconductor device 1e, while good device characteristics are obtained, mechanical reliability is improved, and thus the yield can be improved.

<Display>

Figure 12:
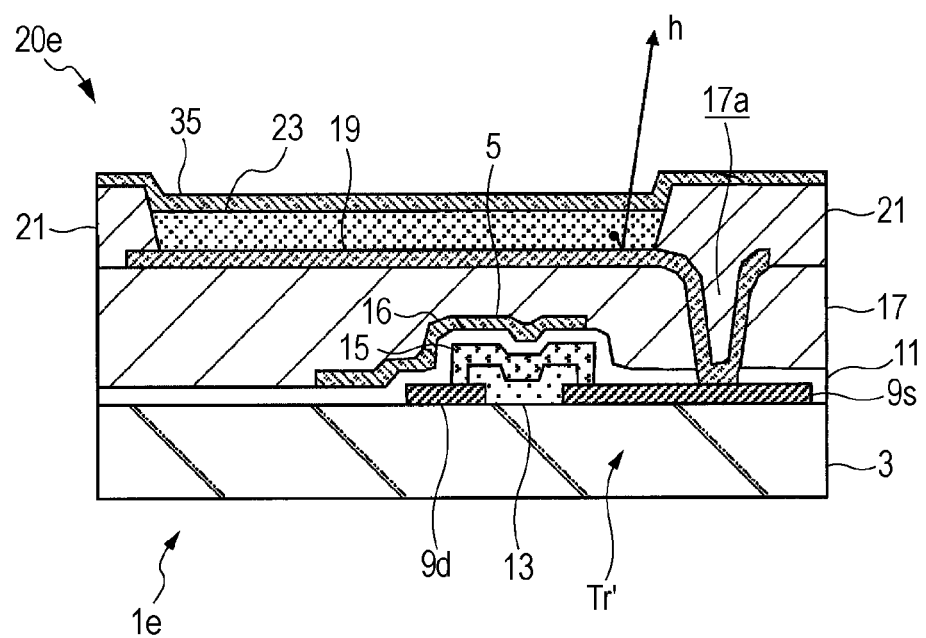
FIG. 12 is a cross-sectional view illustrating a display using a semiconductor device according to the fourth embodiment.

FIG. 12 is a schematic cross-sectional view showing an example of a configuration of each pixel of a display 20e configured using the semiconductor device 1e shown in FIG. 11. The display 20e shown in this drawing differs from the display 20b according to the first embodiment described with reference to FIG. 7 in that the partition wall is not provided in the lower part of the interlayer insulating film 17 formed as a planarizing insulating film, and the other configuration is the same as that of the second embodiment. That is, the display 20e is an organic EL display having an organic electroluminescence device EL for each pixel. A thin film transistor Tr formed on a substrate 3 constitutes a pixel circuit for driving the organic electroluminescence device EL and is provided for each pixel. Furthermore, the conductive pattern 19 of the semiconductor device 1a is formed by patterning as a pixel electrode 19 for each pixel. Furthermore, the pixel electrode 19 is connected to a drain electrode 9d through a connecting hole 17a formed in an interlayer insulating film 17, and an organic EL layer 23 and a counter electrode 25 are stacked on the pixel electrode 19 to form an organic electroluminescence device EL.

In the display 20e having such a configuration, since the semiconductor device 1e configured to have the protective film 15 as described above is used, a display having good characteristics is also realized by the semiconductor device 1e (thin film transistor Tr) having good characteristics, and mechanical reliability can be improved to a large extent.

Modification Example

Figure 13:
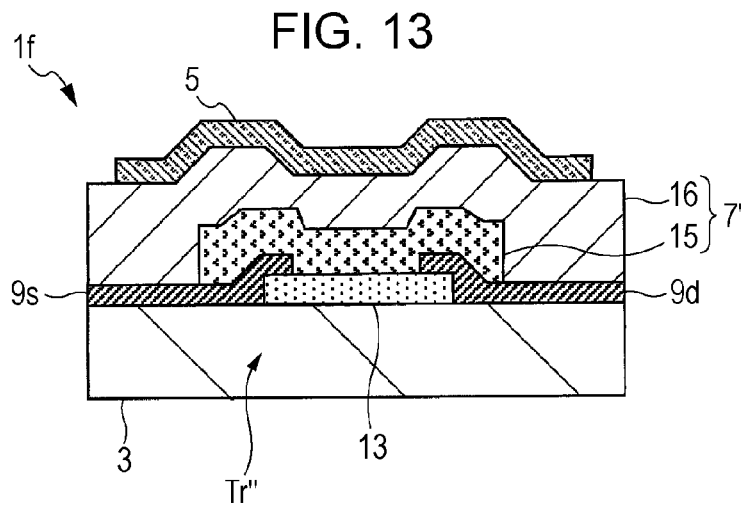
FIG. 13 is a cross-sectional view illustrating a modification example of a semiconductor device according to the fourth embodiment.
Figure 14:
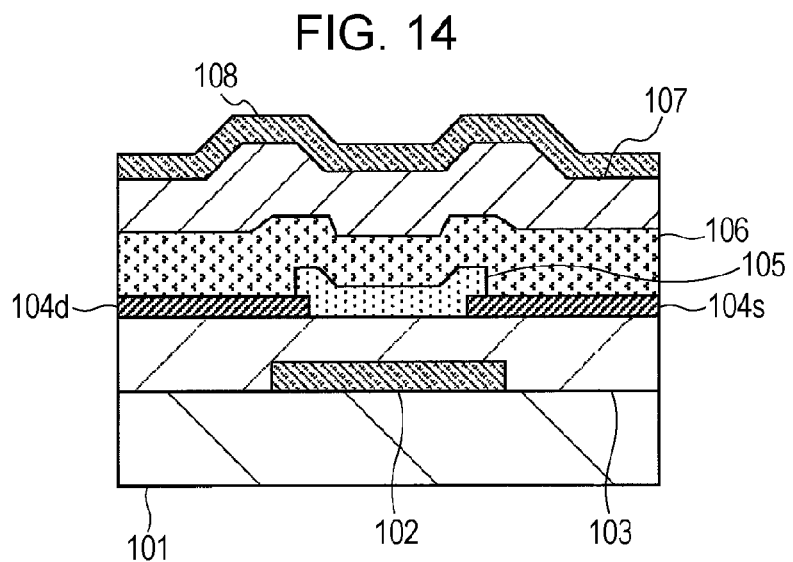
FIG. 14 is a cross-sectional view illustrating a conventional semiconductor device.
Figure 15:
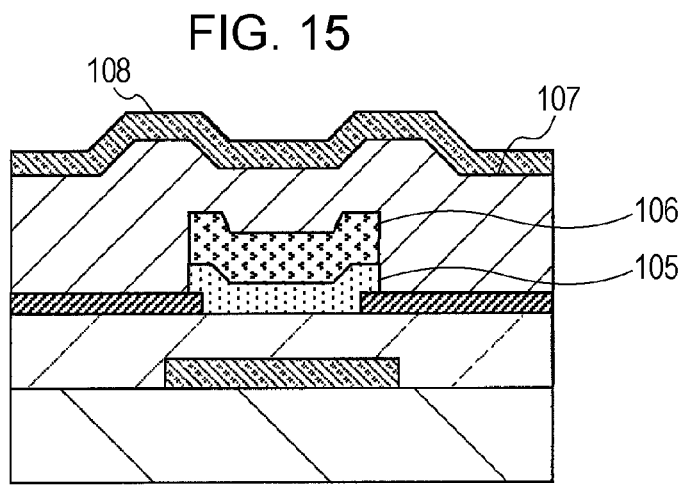
FIG. 15 is a cross-sectional view illustrating another example of a conventional semiconductor device.

A semiconductor device 1f shown in FIG. 13 is a modification example of the fourth embodiment, and includes a top-gate-top-contact-type thin film transistor Tr". The semiconductor device 1f shown in this drawing differs from the semiconductor device 1c according to the fourth embodiment described with reference to FIG. 11 in that a source electrode 9s and a drain electrode 9d are disposed so as to overlap an organic semiconductor layer 13, and the other configuration is the same as that of the fourth embodiment.

In order to form such a semiconductor device 1f, in the procedure of the fourth embodiment, after the organic semiconductor layer 13 is formed, the source electrode 9s and the drain electrode 9d are formed.

Furthermore, the configuration of a display using such a semiconductor device 1f may be obtained by replacing the semiconductor device 1e in the display described with reference to FIG. 12 with the semiconductor device 1f.

In the configuration of the modification example described above, it is also possible to obtain the same advantages as those of the fourth embodiment.

In addition, in the first to fourth embodiments described above, the configuration in which the present invention is applied to organic EL displays is described. However, displays of the present invention can be widely applied to displays driven using thin film transistors, such as liquid crystal displays, and the same advantages can be obtained.

As described above, according to the present invention, it is possible to obtain a semiconductor device and a display in which, while an organic semiconductor layer is sufficiently protected by a protective film, delamination at the protective film interface can be prevented, thereby achieving good device characteristics and improving yield due to improvement in mechanical reliability.

The invention claimed is:

1. A semiconductor device comprising:
   an organic semiconductor layer including a first portion and a second portion on a substrate;
   an insulating partition wall on said substrate and having an opening;
   a protective film on the substrate and covering surfaces of the organic semiconductor layer including a side wall of the first portion of the organic semiconductor layer; and
   an interlayer insulating film covering said protective film, wherein,
       the first portion is within the opening of the insulating partition wall,
       the second portion is disposed on the partition wall, and
       the interlayer insulating film is in contact with a side wall of the second portion.

2. The semiconductor device according to claim 1, wherein:
   the organic semiconductor layer is disposed on the bottom of the opening of the partition wall; and
   the protective film fills the inside of the opening of the partition wall.

3. The semiconductor device according to claim 2, wherein a circumferential edge portion of the protective film is disposed on the partition wall.

4. The semiconductor device according to claim 3, wherein the second portion of the organic semiconductor layer has a same shape as the protective film on the partition wall.

5. The semiconductor device according to claim 1, further comprising:
   a source electrode and a drain electrode under the protective film, the source electrode and the drain electrode having ends that are connected to the organic semiconductor layer; and
   a gate electrode having a region that overlaps a laminated portion of the organic semiconductor layer and the protective film.

6. The semiconductor device according to claim 1, comprising a gate insulating film which covers a gate electrode on the substrate, and has an opening within which the first portion of the organic semiconductor layer is disposed.

7. The semiconductor device according to claim 1, wherein the interlayer insulating film is composed of a photosensitive resist material.

8. The semiconductor device according to claim 1, wherein a conductive pattern is disposed on the interlayer insulating film.

9. The semiconductor device according to claim 1, wherein the protective film is composed of a fluorine-based resin, a water-soluble resin, or a poly(para-xylylene) derivative.

10. A display comprising:
    a gate electrode disposed on a substrate;
    a gate-insulating film which covers the gate electrode;
    a source electrode and a drain electrode disposed on the gate-insulating film;
    an insulating partition wall disposed on the gate-insulating film, the insulating partition wall having an opening which extends to the gate-insulating film between the source electrode and the drain electrode;
    an organic semiconductor layer having a first portion and a second portion, the first portion being disposed above the gate electrode at the bottom of the opening of the partition wall and the second portion being disposed on the partition wall;
    a protective film covering a side wall of the first portion of the organic semiconductor layer and filling an inside of the opening of the partition wall;
    an interlayer insulating film on the protective film and the partition wall, the interlayer insulating film being in contact with a side wall of the second portion; and
    a pixel electrode disposed on the interlayer insulating film and connected to the source electrode or the drain electrode through a connecting hole formed in the interlayer insulating film and the partition wall.

11. A display comprising:
    a source electrode and a drain electrode disposed on a substrate;
    an insulating partition wall disposed on the substrate, the insulating partition wall having an opening which extends to the substrate between the source electrode and the drain electrode;

an organic semiconductor layer having a first portion disposed between the source electrode and the drain electrode at the bottom of the opening of the partition wall;
a protective film covering a side wall of the first portion of the organic semiconductor layer and filling the inside of the opening of the partition wall;
an insulating film on the protective film and the partition wall;
a gate electrode disposed on the insulating film and overlapping the organic semiconductor layer;
an interlayer insulating film which covers the insulating film and the gate electrode; and
a pixel electrode disposed on the interlayer insulating film and connected to the source electrode or the drain electrode through a connecting hole formed in the interlayer insulating film and the partition wall.

* * * * *